United States Patent
Kato et al.

(10) Patent No.: US 7,601,429 B2
(45) Date of Patent: Oct. 13, 2009

(54) PREPREG AND LAMINATE

(75) Inventors: Yoshihiro Kato, Tokyo (JP); Masayoshi Ueno, Tokyo (JP); Takeshi Nobukuni, Tokyo (JP)

(73) Assignee: Mitsubishi Gas Chemical Company, Inc., Tokyo (JP)

(*) Notice: Subject to any disclaimer, the term of this patent is extended or adjusted under 35 U.S.C. 154(b) by 0 days.

(21) Appl. No.: 12/068,298

(22) Filed: Feb. 5, 2008

(65) Prior Publication Data

US 2008/0187763 A1 Aug. 7, 2008

(30) Foreign Application Priority Data

Feb. 7, 2007 (JP) ............................. 2007-028117
Jul. 18, 2007 (JP) ............................. 2007-186929

(51) Int. Cl.
*B32B 15/09* (2006.01)
*B32B 27/18* (2006.01)
*B32B 27/20* (2006.01)
*B32B 27/36* (2006.01)

(52) U.S. Cl. .................. 428/458; 428/447; 428/457; 428/480; 524/261; 524/442; 524/444; 525/418; 525/479; 525/449; 525/533

(58) Field of Classification Search ............. None
See application file for complete search history.

(56) References Cited

U.S. PATENT DOCUMENTS 5,186,880 A * 2/1993 Gaku et al. ............... 264/236
2004/0166324 A1 * 8/2004 Mishima et al. ........... 428/413
2005/0075024 A1 * 4/2005 Ranken et al. ............. 442/141
2005/0182203 A1 * 8/2005 Sugano et al. ............. 525/423
2006/0054589 A1 * 3/2006 Omori et al. ................ 216/13
2006/0084787 A1 * 4/2006 Sugano et al. ............. 528/422
2006/0199301 A1 * 9/2006 Basheer et al. ............ 438/106
2009/0017316 A1 * 1/2009 Kato et al. ................. 428/447

FOREIGN PATENT DOCUMENTS

| EP | 0 581 268 | * | 2/1994 |
| EP | 1 260 551 A1 | | 11/2002 |
| JP | 2000-313737 | * | 11/2000 |
| JP | 2006-193607 | * | 7/2006 |
| JP | 2006-348187 | * | 12/2006 |
| JP | 2007-045968 | * | 2/2007 |
| JP | 2007-045984 | * | 2/2007 |

OTHER PUBLICATIONS

European Search Report issued May 23, 2008 in European Application No. 08 25 0425.

* cited by examiner

*Primary Examiner*—Vivian Chen
(74) *Attorney, Agent, or Firm*—Wenderoth, Lind & Ponack, L.L.P.

(57) ABSTRACT

A prepreg, for printed wiring boards, comprising a flame resistant resin composition containing a specific cyanate ester resin, a nonhalogen epoxy resin, boehmite which is hardly soluble in acids or alkalis and a silicone powder which is a flame retardant assistant, and a base material, which prepreg retains high-degree flame resistance without a halogen compound and has excellent resistance to chemical, high glass transition temperature, excellent soldering heat resistance and excellent heat resistance after moisture absorption, and a laminate or metal-foil-clad laminate obtained by curing the above prepreg.

4 Claims, No Drawings

PREPREG AND LAMINATE

TECHNICAL FIELD OF THE INVENTION

The present invention relates to a prepreg comprising a resin composition having flame resistance for printed wiring boards, and a laminate and a metal-clad laminate, each of which comprises the above prepreg.

BACKGROUND OF THE INVENTION

Semiconductors have been widely used for electronic equipment, communication apparatuses and personal computers. High integration, high functionalization and high-density packaging of semiconductors have been in progress. The speed of the progress has been more and more accelerated. In particular, the technology of mobile devices typified by mobile phones has rapidly advanced in recent years. Technological innovation toward the realization of a ubiquitous-computing society is remarkable.

Semiconductor packages unfold from QFP to area mounting type semiconductor packages such as BGA and CSP. In addition, high-functional semiconductor packages such as MCP and SIP appear. Thus the form of semiconductor packages is becoming various. Therefore, laminates for semiconductor packages are more strongly required to have heat resistance, high stiffness, low thermal expansibility, low water absorption properties and other properties.

Conventionally, FR-4 type laminates obtainable by curing epoxy resins with dicyandiamide are widely used as laminates for printed wiring boards. However, this technology cannot sufficiently cope with a demand for high heat resistance. Cyanate ester resins are known as highly-heat-resistant resins for printed wiring boards. Compositions comprising, as a base composition, resin compositions containing bisphenol A type cyanate ester resins and different thermosetting resins or thermoplastic resins are widely used for laminates for semiconductor packages in recent years.

The above-mentioned bisphenol A type cyanate ester resins have excellent properties in terms of electrical characteristics, mechanical properties, resistance to chemical and adhesive properties. However, the bisphenol A type cyanate ester resins are insufficient under severe conditions from the viewpoint of water absorption properties or heat resistance after moisture absorption in some cases. Therefore, cyanate ester resins having different structures have been studied with the aim of further improvement in properties.

As the cyanate ester resins having different structures, novolak type cyanate ester resins are used in many cases (see, for example, JP-A-11-124433). The novolak type cyanate ester resins are apt to be insufficient in curing degree under normal curing conditions, and cured products obtained therefrom have problems such as a high water absorption coefficient and a decrease in heat resistance after moisture absorption. Prepolymers of the novolak type cyanate ester resins with bisphenol A type cyanate ester resins are disclosed as a technology for improving the novolak type cyanate ester resins (see, for example, JP-A-2000-191776). Although the above prepolymers are improved in curability, the prepolymers are not sufficient in view of improvement in other properties. Further, the use of naphthol aralkyl type cyanate esters has been studied (see, for example, JP-A-2006-193607). The naphthol aralkyl type cyanate esters retain heat resistance owing to their stiff resin skeleton structure. In addition, their curability is increased by decreasing reaction inhibition factors. Thus, resin compositions having a low water absorption coefficient and excellent heat resistance after moisture absorption are obtained.

Further, it is normally necessary for laminates for printed wiring boards for use in electronic equipment to have flame resistance. Conventionally, a bromine-containing flame retardant is jointly used for the purpose of imparting flame resistance (see, for example, JP-A-11-021452). However, resin compositions containing no halogen compound are desired in accordance with a recent growing interest in environmental issues. Phosphorus compounds have been studied as a nonhalogen flame retardant. However, there is a danger that a toxic compound such as phosphine generates at the time of combustion. Silicone-containing flame retardants and metal hydrates are known as other flame retardants. The use of a silicone-containing flame retardant as flame retardant has been also studied (see, for example, JP-A-2006-348187). However, a different flame retardant is required for obtaining high flame resistance. Aluminum hydroxide or the like is known as the metal hydrate. It is known that aluminum hydroxide discharges crystal water at the time of heating and, owing to this reaction, works as a flame retardant. However, when a metal hydrate such as aluminum hydroxide is singly used as a flame retardant, it is necessary in many cases to incorporate the metal hydrate in an amount of 50 wt % or more for attaining UL94V-0 (see, for example, JP-A-2001-226465). When gibbsite, which is a general structure of aluminum hydroxide, is added in a large amount, resistance to chemical such as alkali or acid is apt to be extremely poor. An etching treatment, a desmearing treatment, a plating treatment and the like are carried out in the steps of producing printed wiring boards and these treatments are conducted under severe alkaline or acid conditions. Therefore, it is required to improve an insulating layer which is poor in resistance to chemical.

Further, in the assembly process of semiconductor packages, thermal processing is carried out at 120 to 200° C. in steps of baking, wire-bonding, die attachment, mold resin curing, etc. Lead-free solder is used instead of conventional lead solder in solder ball connection from the viewpoint of environmental issues so that a reflow temperature is increased by 20 to 30° C. Therefore, it is endlessly required that laminates for semiconductor packages have higher heat resistance. Since the dehydration starting temperature of gibbsite is slightly higher than 200° C., laminates using gibbsite as a flame retardant are poor in heat resistance in processing at a high temperature of more than 200° C. in some cases. With regard to laminates, which are required to have high reliability, for semiconductor packages, development of laminates having excellent heat resistance and comprising no halogen compound is desired.

It is required that laminate materials for high-performance printed wiring boards used for semiconductor packages have many properties mentioned above. There are technologies which separately improve individual properties. However, there is a strong demand for a material which has all of the required properties in highly good balance.

SUMMARY OF THE INVENTION

It is an object of the present invention to provide a prepreg and a laminate, for printed wiring board materials, each of which retains high-degree flame resistance without a halogen compound and has excellent resistance to chemical, high glass transition temperature, excellent soldering heat resistance and excellent heat resistance after moisture absorption.

The present inventors have found that the incorporation of a boehmite, which is hardly soluble in acids and alkalis, and a silicone powder, which is a flame retardant assistant, into a cyanate ester resin having a specific structure and a nonhalogen epoxy resin can provide a halogen-free flame-resistant resin composition which is improved in curability by decreasing reaction inhibition factors being due to the molecule structure of cyanate ester resin, or the like, retains heat resistance (high glass transition temperature) owing to the stiff resin skeleton structure and is excellent in resistance to chemical and heat resistance after moisture absorption. On the basis of the above finding, the present inventors have completed the present invention.

That is, the present invention provides a prepreg comprising a resin composition containing a naphthol aralkyl type cyanate ester resin (A) represented by the formula (1), a nonhalogen epoxy resin (B), boehmite (C) and a silicone powder (D), and a base material (E), wherein the amount of the boehmite (C) per 100 parts by weight of the total amount of the naphthol aralkyl type cyanate ester resin (A) and the nonhalogen epoxy resin (B) is 50 to 300 parts by weight and the amount of the silicone powder (D) per 100 parts by weight of the total amount of the naphthol aralkyl type cyanate ester resin (A) and the nonhalogen epoxy resin (B) is 5 to 30 parts by weight,

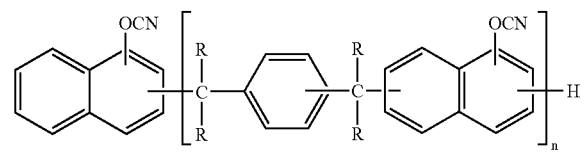

(1)

wherein R represents a hydrogen atom or a methyl group and n is an integer of 1 to 50.

The present invention further provides the prepreg, wherein the ratio (CN/Ep) between the number of cyanate (CN) groups in the naphthol aralkyl type cyanate ester resin (A) and the number of epoxy (Ep) groups in the nonhalogen epoxy resin (B) in the resin composition is in the range of 0.7 to 2.5.

The present invention still further provides a laminate obtained by curing the above prepreg.

The present invention furthermore provides a metal-foil-clad laminate obtained by laminating the above prepreg and a metal foil and curing the prepreg with the metal foil.

EFFECT OF THE INVENTION

A cured product of the prepreg obtained according to the present invention has excellent resistance to chemical, a high glass transition temperature, excellent soldering heat resistance and excellent heat resistance after moisture absorption and also has high flame resistance without using a halogen-containing flame retardant. Therefore, the prepreg of the present invention is suitable as a material for highly-functionalizable printed wiring boards which are required to have high heat resistance and high reliability and are produced under severe conditions where high resistance to chemical is required. Industrial practical utilities thereof are remarkably high.

DETAILED DESCRIPTION OF THE INVENTION

The naphthol aralkyl type cyanate ester-resin (A) used in the present invention is not specially limited so long as it is a naphthol aralkyl type cyanate ester resin represented by the formula (1). Prepolymers thereof obtained by heating can be also used. The naphthol aralkyl type cyanate ester resin (A) represented by the formula (1) is obtained by condensation of a cyanic acid and a naphthol aralkyl resin obtained by reaction of a naphthol such as α-naphthol or β-naphthol and p-xylyleneglycol, α,α'-dimethoxy-p-xylene, 1,4-di(2-hydroxy-2-propyl)benzene or the like. The process for producing the naphthol aralkyl type cyanate ester resin (A) of the formula (1) is not specially limited. It may be produced by any cyanate ester synthesis method. Specifically, for example, it can be obtained by reacting a naphthol aralkyl resin represented by the formula (2) with cyanogen halide in an inactive organic solvent in the presence of a basic compound. Further, it can be synthesized by forming a salt of a similar naphthol aralkyl resin and a basic compound in a water-containing solution and then reacting the salt with cyanogen halide in a two-phase interface reaction.

(2)

wherein R represents a hydrogen atom or a methyl group and n is an integer of 1 to 50.

The nonhalogen epoxy resin (B) used in the present invention is not specially limited so long as it is a compound which has at least two epoxy groups in a molecule and intentionally does not have a halogen atom in a molecule structure. Examples thereof include a bisphenol A type epoxy resin, a bisphenol F type epoxy resin, a phenol novolak type epoxy resin, a cresol novolak type epoxy resin, a bisphenol A novolak type epoxy resin, a trifunctional phenol type epoxy resin, a tetrafunctional phenol type epoxy resin, a naphthalene type epoxy resin, a biphenyl type epoxy resin, an aralkyl novolak type epoxy resin, an alicyclic epoxy resin, a polyol type epoxy resin, glycidyl amine, glycidyl ester, compounds obtained by epoxidation of a double bond of butadiene or the like, and compounds obtained by a reaction of a hydroxyl-group-containing silicon resin with epichlorohydrin. In particular, an aralkyl novolak type epoxy resin is preferable in view of improvement in flame resistance. The aralkyl novolak type epoxy resin refers to a compound which can be represented by the formula (3). Examples thereof include a phenol phenyl aralkyl type epoxy resin, a phenol biphenyl aralkyl type epoxy resin and a naphthol aralkyl type epoxy resin. The nonhalogen epoxy resins (B) can be used alone or in combination, as required.

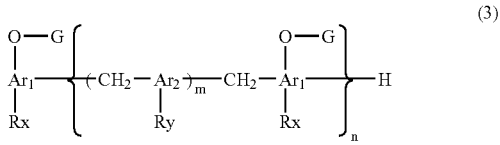

(3)

wherein G represents a glycidyl group, each of $Ar_1$ and $Ar_2$ represents an aryl group having as substituent a monocyclic or polycyclic aromatic hydrocarbon, such as a phenyl group, a naphthyl group or a biphenyl group, each of Rx and Ry represents a hydrogen atom, an alkyl group or an aryl group, m is an integer of 1 to 5 and n is an integer of 1 to 50.

In the present invention, it is preferred that the naphthol aralkyl type cyanate ester resin (A) and the nonhalogen epoxy resin (B) are contained in the resin composition such that the ratio (CN/Ep) of the number of cyanate (CN) groups of the naphthol aralkyl type cyanate ester resin (A) and the number of epoxy (Ep) groups of the nonhalogen epoxy resin (B) in the resin composition is 0.7 to 2.5. When CN/Ep is less than 0.7, the flame resistance of a laminate decreases. When it exceeds 2.5, curability decreases in some cases.

A characteristic feature of the present invention is to contain boehmite (C). Gibbsite has been preferably used as an inorganic flame retardant for laminates, which do not use a halogen-containing flame retardant, for printed wiring boards. However, a problem is that a laminate is poor in resistance to chemical. It has been found that, when boehmite (C) which is hardly soluble in acids or alkalis is added to a resin composition containing the cyanate ester resin (A) used in the present invention, a laminate retains flame resistance and also increases in resistance to chemical. It has been further found that boehmite improves soldering heat resistance since the amount of crystal water of boehmite is smaller than that of gibbsite and the dehydration starting temperature of boehmite is higher than that of gibbsite. The average particle diameter (D50) of the boehmite used in the present invention is not specially limited. The average particle diameter (D50) is preferably 0.2 to 5 μm in view of dispersibility. The amount of the boehmite to be added is 50 to 300 parts by weight per 100 parts by weight of the total amount of the cyanate ester resin (A) and the nonhalogen epoxy resin (B). For lowering the thermal expansion coefficient of laminate in the thickness direction, it is better to increase the amount of the boehmite. However, when the amount of the boehmite is too large, the viscosity of a resin varnish increases, which worsens handling properties and also decreases moldability in some cases. Therefore, the amount of the boehmite is particularly preferably in the range of 80 to 250 parts by weight.

The resin composition of the prepreg of the present invention can further contain a different inorganic filler other than the above boehmite (C). Specific examples thereof include silicas such as natural silica, fused silica, amorphous silica and hollow silica, molybdenum compounds such as molybdenum oxide and zinc molybdate, zinc borate, zinc stannate, alumina, clay, kaolin, talc, calcined clay, calcined kaolin, calcined talc, mica, short glass fiber (glass fine powders such as E glass or D glass) and hollow glass. The average particle diameter (D50) of the inorganic filler other than the boehmite (C) is not specially limited. The average particle diameter (D50) of the inorganic filler is preferably 0.2 to 5 μm in view of dispersibility. The inorganic filler is incorporated such that the total amount of the boehmite (C) and the inorganic filler is 300 parts by weight or less per 100 parts by weight of the total amount of the cyanate ester resin (A) and the nonhalogen epoxy resin (B). When the amount of the inorganic filler is too large, moldability decreases in some cases. Therefore, the total amount of the inorganic filler and the boehmite (C) is particularly preferably 250 parts by weight or less.

With regard to the inorganic filler to be jointly used with the boehmite (C), a silane coupling agent or a wetting and dispersing agent can be jointly used. The silane coupling agent is not specially limited so long as it is selected from general silane coupling agents which are used for surface-treating inorganic compounds. Specific examples thereof include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride, and phenylsilane coupling agents. These silane coupling agents can be used alone or in combination as required. The wetting and dispersing agent is not specially limited so long as it is selected from dispersion stabilizers which are used for coatings. Examples thereof include acid-group-containing copolymer-based wetting and dispersing agents such as Disperbyk-110, 111 and 180 and BYK-W996, W9010 and W903, supplied by Big Chemie Japan.

The silicone powder (D) used in the present invention includes a fine powder of polymethylsilsesquioxane where a siloxane bond is three-dimensionally reticulately cross-linked; a fine powder of an addition polymer of a vinyl-group-containing dimethylpolysiloxane and methylhydrogenpolysiloxane; a powder obtained by coating the surface of a fine powder of an addition polymer of a vinyl-group-containing dimethylpolysiloxane and methylhydrogenpolysiloxane with polymethylsilsesquioxane where a siloxane bond is three-dimensionally reticulately cross-linked; a powder obtained by coating the surface of an inorganic support with polymethylsilsesquioxane where a siloxane bond is three-dimensionally reticulately cross-linked; and the like. The silicone powder retards a combustion time and functions as a flame retardant assistant which increases a flame resistant effect. It has been found that, when the silicone powder is added in an amount of 5 parts by weight or more per 100 parts by weight of the total amount of the naphthol aralkyl type cyanate ester resin (A) and the nonhalogen epoxy resin (B), a remarkable flame resistant effect can be obtained. The amount of the silicone powder to be added is 5 to 30 parts by weight, preferably 5 to 20 parts by weight, per 100 parts by weight of the total amount of the naphthol aralkyl type cyanate ester resin (A) and the nonhalogen epoxy resin (B).

The resin composition of the prepreg of the present invention can further contain a bismaleimide compound. The bismaleimide compound is not specially limited so long as it is a compound having two maleimide groups in a molecule. Specific examples thereof include bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane and bis(3,5-diethyl-4-maleimidophenyl)methane. Further, prepolymers of these bismaleimide compounds and a prepolymer of such bismaleimide compound and an amine compound can be also used. The bismaleimide compounds may be used alone or in combination as required. The bismaleimide compound is more preferably bis(4-maleimidophenyl)methane, 2,2-bis{4-(4-maleimidophenoxy)-phenyl}propane or bis(3-ethyl-5-methyl-4-maleimidophenyl)methane.

The resin composition of the prepreg of the present invention can further contain a variety of high polymer compounds such as a different thermosetting resin, a thermoplastic resin, and oligomers and elastomers thereof, a different flame resistant compound or an additive, so long as the inherent properties of the resin composition are not impaired. They are not specially limited so long as they are selected from those which are generally used. Examples of the flame resistant compound include a nitrogen-containing compound such as melamine or benzoguanamine, and an oxazine-ring-containing compound. Examples of the additive include an ultraviolet absorber, an antioxidant, a photopolymerization initiator, a fluorescent brightening agent, a photosensitizer, a dye, a pigment, a thickener, a lubricant, an antifoamer, a dispersing agent, a leveling agent, a brightener and a polymerization inhibitor. They may be used in combination as required.

The base material (E) used in the present invention can be selected from known base materials which are used for a variety of printed wiring board materials. Examples thereof include glass fibers such as E glass, D glass, S glass and NE glass, inorganic fibers other than glass, and organic fibers such as polyimide, polyamide and polyester. It is possible to select the base material in accordance with intended use or performance as required. The form of the base material is typically a woven fabric, a nonwoven fabric, roving, a chopped strand mat or a surfacing mat. The thickness of the base material is not specially limited. The thickness of the base material is generally about 0.01 to 0.3 mm. Of these base materials, a base material of a glass fiber is preferred in view of strength and water absorption properties.

The resin composition of the prepreg of the present invention can further contain a curing accelerator, as required, for the purpose of properly controlling the curing speed. The curing accelerator is not specially limited so long as it is selected from curing accelerators which are generally used for the naphthol aralkyl type cyanate ester resin (A) or the nonhalogen epoxy resin (B). Specific examples thereof include organic metal salts such as copper, zinc, cobalt and nickel, imidazoles and derivatives thereof, and tertiary amines.

The process for producing the prepreg of the present invention is not specially limited so long as it is a method in which the prepreg is produced by combining a resin composition containing as essential components the naphthol aralkyl type cyanate ester resin (A), the nonhalogen epoxy resin (B), the boehmite (C) and the silicone powder (D) with the base material (E). For example, the prepreg can be produced by impregnating or applying a resin varnish comprising the above resin composition into/to the base material (E) and then semi-curing the impregnated or applied resin varnish by means of, for instance, heating in a dryer at 100 to 200° C. for 1 to 60 minutes. The total amount of resins and inorganic fillers of the resin composition in the prepreg is preferably 20 to 90% by weight based on the total prepreg weight.

An organic solvent used for the above resin varnish is not specially limited so long as it is compatible with a mixture of the naphthol aralkyl type cyanate ester resin (A) and the nonhalogen epoxy resin (B). Specific examples thereof include ketones such as acetone, methyl ethyl ketone, methyl isobutyl ketone and cyclohexanone, aromatic hydrocarbons such as benzene, toluene and xylene, and amides such as dimethylformamide and dimethylacetamide.

The laminate of the present invention is obtained by laminate-molding using the above prepreg. Specifically, the laminate of the present invention is produced by placing one prepreg as prepared above or stacking two or more prepregs as prepared above, disposing metal foil(s) such as a copper foil or an aluminum foil on one surface or both surfaces of the prepreg or the stacked prepregs, as required, and laminate-molding the resultant set. The metal foil to be used is not specially limited so long as it is selected from metal foils which can be used for printed wiring board materials. With regard to molding conditions, general means for laminates and multilayer boards for printed wiring boards can be adopted. For example, a multiplaten press, a multiplaten vacuum press, continuous molding, an autoclave molding machine or the like is used, the temperature is generally from 100 to 300° C., the pressure is generally from 2 to 100 kgf/cm$^2$, and the heating time is generally from 0.05 to 5 hours. Further, it is possible to carry out post-curing at a temperature of 150 to 300° C. as required.

EXAMPLES

The present invention will be explained in detail with reference to Synthetic Examples, Examples and Comparative Examples hereinafter, while the present invention shall not be limited to these Examples.

Synthetic Example 1

Synthesis—1 of α-naphthol aralkyl type cyanate ester resin (4)

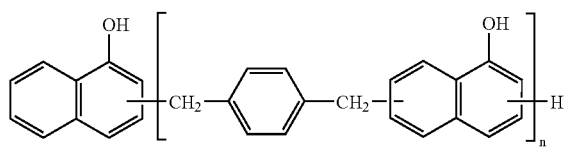

103 g (OH group 0.47 mol) of an α-naphthol aralkyl resin (SN485, OH group equivalent: 219 g/eq., softening point: 86° C., supplied by Nippon Steel Chemical Co., Ltd.) represented by the above formula (4) was dissolved in 500 ml of chloroform, and 0.7 mol of triethylamine was mixed with the resultant solution. The resultant mixture was dropwise added to 300 g of a chloroform solution of 0.93 mol of cyanogen chloride at −10° C. over 1.5 hours. The mixture was stirred for 30 minutes. Further, a mixed solution of 0.1 mol of triethylamine and 30 g of chloroform was dropwise added to the mixture, and the resultant mixture was stirred for 30 minutes, to complete the reaction. A hydrochloride of triethylamine generated was separated by filtration. The filtrate obtained was washed with 500 ml of 0.1 N hydrochloric acid. Then, washing with 500 ml of water was repeated four times. Then, a chloroform layer of chloroform/water mixed solution was extracted by liquid-separation treatment. Sodium sulfate was added to the chloroform solution and dehydration treatment was carried out. The sodium sulfate was separated by filtration. Then, evaporation was carried out at 75° C. and degassing under reduced pressure was carried out at 90° C., thereby obtaining a brown solid α-naphthol aralkyl type cyanate ester resin represented by the formula (5). The absorption of a cyanate ester group was confirmed around 2264 cm−1 in an infrared absorption spectrum. Further, its structure was identified by 13C-NMR and 1H-NMR. The percentage of conversion from OH groups to OCN groups was 99% or more.

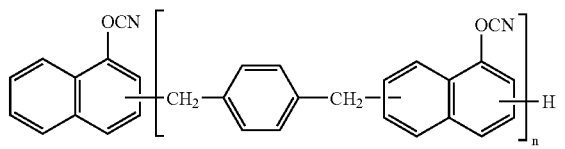

(5)

Synthetic Example 2

Synthesis—2 of α-naphthol aralkyl type cyanate ester resin

An α-naphthol aralkyl type cyanate ester resin was synthesized in the same manner as in Synthetic Example 1 except that 103 g (OH group 0.47 mol) of the α-naphthol aralkyl resin (SN485, OH group equivalent: 219 g/eq., softening point: 86° C., supplied by Nippon Steel Chemical Co., Ltd.) was replaced with 102 g (OH group 0.45 mol) of an α-naphthol aralkyl resin (SN4105, OH group equivalent: 226 g/eq., softening point: 105° C., supplied by Nippon Steel Chemical Co., Ltd.) and that the amount of the cyanogen chloride was changed from 0.93 mol to 0.90 mol.

Example 1

35 parts by weight of the α-naphthol aralkyl type cyanate ester resin (cyanate equivalent: 237 g/eq.) synthesized in Synthetic Example 1, 65 parts by weight of a phenol biphenyl aralkyl type epoxy resin (NC-3000-FH, epoxy equivalent: 320 g/eq., supplied by Nippon kayaku Co., Ltd.) and 1.5 parts by weight of a wetting and dispersing agent (BYK-W903, supplied by BYK chemie Japan) were dissolved in methyl ethyl ketone. Further, 10 parts by weight of a silicone powder (Tospearl 120, supplied by GE Toshiba Silicones), 150 parts by weight of boehmite (BN100, supplied by Kawai Lime Industrial Co., Ltd.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 51% by weight.

Example 2

64 parts by weight of the α-naphthol aralkyl type cyanate ester resin (cyanate equivalent: 237 g/eq.) synthesized in Synthetic Example 1, 18 parts by weight of a phenol phenyl aralkyl type epoxy resin (E-XLC-LL: 240 g/eq., supplied by Nippon kayaku Co., Ltd.), 18 parts by weight of a naphthol aralkyl type epoxy resin (ESN-175, epoxy equivalent: 268 g/eq., supplied by Tohto Kasei Co., Ltd.), 2 parts by weight of a silane coupling agent (Z6040, supplied by Dow Corning Toray Co., Ltd.) and 1 part by weight of a wetting and dispersing agent (BYK-W996, supplied by BYK chemie Japan) were dissolved in methyl ethyl ketone. Further, 10 parts by weight of a silicone powder (Tospearl 130, supplied by GE Toshiba Silicones), 80 parts by weight of boehmite (BS100, supplied by Kawai Lime Industrial Co., Ltd.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 48% by weight.

Example 3

50 parts by weight of the α-naphthol aralkyl type cyanate ester resin (cyanate equivalent: 237 g/eq.) synthesized in Synthetic Example 1, 50 parts by weight of a phenol novolak type epoxy resin (EPICLON N-770, epoxy equivalent: 190 g/eq., supplied by Dainippon Ink And Chemicals, Incorporated) and 1 part by weight of a wetting and dispersing agent (BYK-W996, supplied by BYK chemie Japan) were dissolved in methyl ethyl ketone. Further, 20 parts by weight of a silicone powder (Tospearl 130, supplied by GE Toshiba Silicones), 3 parts by weight of talc coated with zinc molybdate (Kemgard 911C, zinc molybdate support: 10% by weight, supplied by Sherwin Williams Chemicals), 120 parts by weight of boehmite (BN100, supplied by Kawai Lime Industrial Co., Ltd.), 15 parts by weight of calcined talc (BST-200L, supplied by NIPPON TALC CO., LTD.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 50% by weight.

Example 4

50 parts by weight of the α-naphthol aralkyl type cyanate ester resin (cyanate equivalent: 237 g/eq.) synthesized in Synthetic Example 1, 10 parts by weight of a naphthol aralkyl type epoxy resin (ESN-175, epoxy equivalent: 268 g/eq., supplied by Tohto Kasei Co., Ltd.), 30 parts by weight of a tris(hydroxyphenyl)methane type epoxy resin (EPPN-501HY, epoxy equivalent: 169 g/eq., supplied by Nippon kayaku Co., Ltd.), 10 parts by weight of a naphthalene skeleton type epoxy resin (HP-4032D, epoxy equivalent: 140 g/eq., supplied by Dainippon Ink And Chemicals, Incorporated), 2 parts by weight of a silane coupling agent (Z6040, supplied by Dow Corning Toray Co., Ltd.) and 2.0 parts by weight of a wetting and dispersing agent (BYK-W903, supplied by BYK chemie Japan) were dissolved in methyl ethyl ketone. Further, 20 parts by weight of a silicone powder (KMP-590, supplied by Shin-Etsu Chemical Co., Ltd.), 3 parts by weight of talc coated with zinc molybdate (Kemgard 911C, zinc molybdate support: 10% by weight, supplied by Sherwin Williams Chemicals), 200 parts by weight of boehmite (BN100, supplied by Kawai Lime Industrial Co., Ltd.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 50% by weight.

Example 5

55 parts by weight of the α-naphthol aralkyl type cyanate ester resin (cyanate equivalent: 237 g/eq.) synthesized in Synthetic Example 1, 20 parts by weight of a phenol phenyl aralkyl type epoxy resin (E-XLC-LL, epoxy equivalent: 240 g/eq., supplied by Nippon kayaku Co., Ltd.), 20 parts by weight of a phenol novolak type epoxy resin (EPICLON N-770, epoxy equivalent: 190 g/eq., supplied by Dainippon Ink And Chemicals, Incorporated), 5 parts by weight of a naphthalene skeleton type epoxy resin (HP-4032D, epoxy equivalent: 140 g/eq., supplied by Dainippon Ink And Chemicals, Incorporated), 2 parts by weight of a silane coupling agent (Z6040, supplied by Dow Corning Toray Co., Ltd.) and 1.5 parts by weight of a wetting and dispersing agent (BYK-W903, supplied by BYK chemie Japan) were dissolved in methyl ethyl ketone. Further, 15 parts by weight of a silicone powder (KMP-701, supplied by Shin-Etsu Chemical Co., Ltd.), 3 parts by weight of talc coated with zinc molybdate (Kemgard 911C, zinc molybdate support: 10% by weight, supplied by Sherwin Williams Chemicals), 150 parts by weight of boehmite (BN100, supplied by Kawai Lime Industrial Co., Ltd.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 51% by weight.

Example 6

55 parts by weight of the α-naphthol aralkyl type cyanate ester resin (cyanate equivalent: 237 g/eq.) synthesized in Synthetic Example 1, 20 parts by weight of a phenol biphenyl aralkyl type epoxy resin (NC-3000-FH, epoxy equivalent: 320 g/eq., supplied by Nippon kayaku Co., Ltd.), 20 parts by weight of a tris(hydroxyphenyl)methane type epoxy resin (EPPN-501HY, epoxy equivalent: 169 g/eq., supplied by Nippon kayaku Co., Ltd.), 5 parts by weight of a naphthalene skeleton type epoxy resin (HP-4032D, epoxy equivalent: 140 g/eq., supplied by Dainippon Ink And Chemicals, Incorporated), 2 parts by weight of a silane coupling agent (Z6040, supplied by Dow Corning Toray Co., Ltd.) and 1.5 parts by weight of a wetting and dispersing agent (BYK-W903, supplied by BYK chemie Japan) were dissolved in methyl ethyl ketone. Further, 10 parts by weight of a silicone powder (Tospearl 130, supplied by GE Toshiba Silicones), 3 parts by weight of talc coated with zinc molybdate (Kemgard 911C, zinc molybdate support: 10% by weight, supplied by Sherwin Williams Chemicals), 120 parts by weight of boehmite (BN100, supplied by Kawai Lime Industrial Co., Ltd.), 15 parts by weight of a spherical synthetic silica (SC-2050, supplied by ADMATECHS CO., LTD) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 50% by weight.

Example 7

50 parts by weight of the α-naphthol aralkyl type cyanate ester resin (cyanate equivalent: 237 g/eq.) synthesized in Synthetic Example 1, 50 parts by weight of a phenol biphenyl aralkyl type epoxy resin (NC-3000-FH, epoxy equivalent: 320 g/eq., supplied by Nippon kayaku Co., Ltd.) and 2 parts by weight of a silane coupling agent (Z6040, supplied by Dow Corning Toray Co., Ltd.) were dissolved in methyl ethyl ketone. Further, 5 parts by weight of a silicone powder (KMP-590, supplied by Shin-Etsu Chemical Co., Ltd.), 3 parts by weight of talc coated with zinc molybdate (Kemgard 911C, zinc molybdate support: 10% by weight, supplied by Sherwin Williams Chemicals), 80 parts by weight of boehmite (BN100, supplied by Kawai Lime Industrial Co., Ltd.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 48% by weight.

Example 8

45 parts by weight of the α-naphthol aralkyl type cyanate ester resin (cyanate equivalent: 237 g/eq.) synthesized in Synthetic Example 1, 28 parts by weight of a phenol biphenyl aralkyl type epoxy resin (NC-3000-FH, epoxy equivalent: 320 g/eq., supplied by Nippon kayaku Co., Ltd.), 27 parts by weight of a tris(hydroxyphenyl)methane type epoxy resin (EPPN-501HY, epoxy equivalent: 169 g/eq., supplied by Nippon kayaku Co., Ltd.), 2 parts by weight of a silane coupling agent (Z6040, supplied by Dow Corning Toray Co., Ltd.) and 1.5 parts by weight of a wetting and dispersing agent (BYK-W903, supplied by BYK chemie Japan) were dissolved in methyl ethyl ketone. Further, 10 parts by weight of a silicone powder (KMP-600, supplied by Shin-Etsu Chemical Co., Ltd.), 3 parts by weight of talc coated with zinc molybdate (Kemgard 911C, zinc molybdate support: 10% by weight, supplied by Sherwin Williams Chemicals), 250 parts by weight of boehmite (BN100, supplied by Kawai Lime Industrial Co., Ltd.) and 0.02 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 51% by weight.

Example 9

70 parts by weight of the α-naphthol aralkyl type cyanate ester resin (cyanate equivalent: 237 g/eq.) synthesized in Synthetic Example 1, 15 parts by weight of a phenol biphenyl aralkyl type epoxy resin (NC-3000-FH, epoxy equivalent: 320 g/eq., supplied by Nippon kayaku Co., Ltd.), 15 parts by weight of a phenol novolak type epoxy resin (EPICLON N-770, epoxy equivalent: 190 g/eq., supplied by Dainippon Ink And Chemicals, Incorporated) and 1 part by weight of a wetting and dispersing agent (BYK-W996, supplied by BYK chemie Japan) were dissolved in methyl ethyl ketone. Further, 15 parts by weight of a silicone powder (Tospearl 130, supplied by GE Toshiba Silicones), 80 parts by weight of boehmite (BN100, supplied by Kawai Lime Industrial Co., Ltd.), 20 parts by weight of calcined talc (BST-200L, supplied by NIPPON TALC CO., LTD.) and 0.01 part by weight of zinc octylate were mixed with the resultant solution, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 49% by weight.

Example 10

A prepreg was obtained in the same manner as in Example 7 except that the α-naphthol aralkyl type cyanate ester resin (cyanate equivalent: 237 g/eq.) obtained in Synthetic Example 1, used in Example 7, was replaced with the α-naphthol aralkyl type cyanate ester resin (cyanate equivalent: 244 g/eq.) obtained in Synthetic Example 2.

Example 11

A prepreg was obtained in the same manner as in Example 8 except that the α-naphthol aralkyl type cyanate ester resin (cyanate equivalent: 237 g/eq.) obtained in Synthetic Example 1, used in Example 8, was replaced with the α-naphthol aralkyl type cyanate ester resin (cyanate equivalent: 244 g/eq.) obtained in Synthetic Example 2.

Comparative Example 1

A prepreg was obtained in the same manner as in Example 1 except that 150 parts by weight of the boehmite (BN100, supplied by Kawai Lime Industrial Co., Ltd.) used in Example 1 was replaced with 150 parts by weight of gibbsite (aluminum hydroxide CL303, supplied by Sumitomo Chemical Co. Ltd.).

Comparative Example 2

A prepreg was obtained in the same manner as in Example 2 except that 80 parts by weight of the boehmite (BS100, supplied by Kawai Lime Industrial Co., Ltd.) used in Example 2 was replaced with 80 parts by weight of gibbsite (aluminum hydroxide CL303, supplied by Sumitomo Chemical Co. Ltd.).

Comparative Example 3

A prepreg was obtained in the same manner as in Example 3 except that 20 parts by weight of the silicone powder (Tospearl 130, supplied by GE Toshiba Silicones) used in Example 3 was not used.

Comparative Example 4

A prepreg was obtained in the same manner as in Example 4 except that 20 parts by weight of the silicone powder (KMP-590, supplied by Shin-Etsu Chemical Co., Ltd.) used in Example 4 was not used.

Comparative Example 5

A prepreg was obtained in the same manner as in Comparative Example 4 except that 200 parts by weight of the boehmite (BN100, supplied by Kawai Lime Industrial Co., Ltd.) used in Comparative Example 4 was replaced with 200 parts by weight of gibbsite (aluminum hydroxide CL303, supplied by Sumitomo Chemical Co. Ltd.).

Comparative Example 6

A prepreg was obtained in the same manner as in Example 5 except that 55 parts by weight of the α-naphthol aralkyl type cyanate ester resin (cyanate equivalent: 237 g/eq.) used in Example 5 was replaced with 55 parts by weight of a prepolymer of 2,2-bis(4-cyanatophenyl)propane (BT2070, cyanate equivalent: 139 g/eq., supplied by Mitsubishi Gas Chemical Company, Inc.).

Comparative Example 7

A prepreg was obtained in the same manner as in Example 6 except that 55 parts by weight of the α-naphthol aralkyl type cyanate ester resin (cyanate equivalent: 237 g/eq.) used in Example 6 was replaced with 55 parts by weight of a phenol novolak type cyanate (PT-30, cyanate equivalent: 126 g/eq., supplied by Lonza).

Comparative Example 8

50 parts by weight of a prepolymer of 2,2-bis(4-cyanatophenyl)propane (BT2070, cyanate equivalent: 139 g/eq., supplied by Mitsubishi Gas Chemical Company, Inc.), 50 parts by weight of a phenol biphenyl aralkyl type epoxy resin (NC-3000-FH, epoxy equivalent: 320 g/eq., supplied by Nippon kayaku Co., Ltd.), 10 parts by weight of a silicone powder (Tospearl 120, supplied by GE Toshiba Silicones), 150 parts by weight of a spherical fused silica (SC2050MR, supplied by ADMATECHS CO., LTD), 2 parts by weight of a silane coupling agent (Z6040, supplied by Dow Corning Toray Co., Ltd.) and 0.01 part by weight of zinc octylate were mixed, thereby obtaining a varnish. The varnish was diluted with methyl ethyl ketone, the diluted varnish was impregnated into an E glass cloth (specific gravity: 2.5 g/cm$^3$) having a thickness of 0.1 mm and the impregnated varnish was dried under heat at 160° C. for 4 minutes, thereby obtaining a prepreg having a resin content of 50% by weight.

Preparation of Metal-Foil-Clad Laminates 1

Four prepregs obtained in Example 1 were stacked, 18 μm-thick electrolytic copper foils (3EC-III, supplied by Mitsui Mining and Smelting Co., Ltd.) were placed on the upper and lower surfaces of the stacked prepregs, one copper foil on the upper surface and one copper foil on the lower surface, and the resultant set was laminate-molded at a pressure of 30 kgf/cm$^2$ at a temperature of 220° C. for 120 minutes, to obtain a copper-clad laminate having an insulating layer thickness of 0.4 mm. The prepregs obtained in Examples 2 toll and Comparative Examples 1 to 8 were similarly processed, thereby obtaining copper-clad laminates each having an insulating layer thickness of 0.4 mm, respectively.

Preparation of Metal-Foil-Clad Laminates 2

Eight prepregs obtained in Example 1 were stacked, 18 μm-thick electrolytic copper foils (3EC-III, supplied by Mitsui Mining and Smelting Co., Ltd.) were placed on the upper and lower surfaces of the stacked prepregs, one copper foil on the upper surface and one copper foil on the lower surface, and the resultant set was laminate-molded at a pressure of 30 kgf/cm$^2$ at a temperature of 220° C. for 120 minutes, to obtain a copper-clad laminate having an insulating layer thickness of 0.8 mm. The prepregs obtained in Examples 2 to 11 and Comparative Examples 1 to 8 were similarly processed, thereby obtaining copper-clad laminates each having an insulating layer thickness of 0.8 mm, respectively.

Preparation of Metal-Foil-Clad Laminates 3

Two prepregs obtained in Example 1 were stacked, 18 μm-thick electrolytic copper foils (3EC-III, supplied by Mitsui Mining and Smelting Co., Ltd.) were placed on the upper and lower surfaces of the stacked prepregs, one copper foil on the upper surface and one copper foil on the lower surface, and the resultant set was laminate-molded at a pressure of 30 kgf/cm$^2$ at a temperature of 220° C. for 120 minutes, to obtain a copper-clad laminate having an insulating layer thickness of 0.2 mm. The prepregs obtained in Examples 2 to 11 and Comparative Examples 1 to 8 were similarly processed, thereby obtaining copper-clad laminates each having an insulating layer thickness of 0.2 mm, respectively.

The metal-clad laminates 1 were evaluated for glass transition temperature, thermal expansion coefficient, soldering heat resistance and heat resistance after moisture absorption.

In the evaluation of glass transition temperature and thermal expansion coefficient, a metal-foil-clad laminate 1 was etched to remove copper foils, to obtain a sample, and the sample was used. In the evaluation of soldering heat resistance, a metal-foil-clad laminate 1 was used. In the evaluation of heat resistance after moisture absorption, copper foils of a metal-foil-clad laminate 1 other than a copper foil on the half of one surface thereof were removed by etching to obtain a sample, and the sample was used. The evaluation methods were as follows.

Glass transition temperature: A sample was measured with a dynamic viscoelasticity analyzer (supplied by TA Instruments) in accordance with JIS C6481.

Thermal expansion coefficient: A sample was temperature-increased with a thermomechanical analyzer (supplied by TA Instruments) from 40° C. to 340° C. at a temperature-increasing rate of 10° C./min. and the sample was measured for a linear expansion coefficient in the thickness direction from 60° C. to 120° C.

Soldering heat resistance: A sample having a size of 5 cm×5 cm was dried at 115° C. for 20 hours. Then, the sample was floated in a solder bath at 288° C. and the time that elapsed before swelling of the sample was measured.

Symbols of soldering heat resistance in Table 1 have the following meanings. O: The sample did not swell 30 minutes or more later. x: The sample had swollen before 30 minutes passed.

Heat resistance after moisture absorption: A sample having a size of 5 cm×5 cm was dried at 115° C. for 20 hours. Then, the sample was treated with a pressure cooker testing machine (PC-3 type, supplied by Hirayama Manufacturing Corporation) at 121° C. at 2 atmospheric pressure for 4 hours, then the sample was immersed in a solder bath at 260° C. for 60 seconds, and the presence or absence of swelling was checked by visual observation.

Symbols of heat resistance after moisture absorption in Table 1 have the following meanings. O: No defect found. Δ: Measling occurred. x: Swelling occurred.

The copper foils of the metal-foil-clad laminates 1 and 2 were removed by etching and then the laminates were evaluated for flame resistance by the following methods.

Combustion test: Evaluation was carried out in accordance with a UL 94 vertical combustion test method.

In Table 1, "Flame resistance 1," shows the results of the metal-foil-clad laminates 1 and "Flame resistance 2" shows the results of the metal-foil-clad laminates 2.

The copper foils of the metal-foil-clad laminates 3 were removed by etching and then the laminates were evaluated for resistance to alkali and resistance to acid by the following methods.

Resistance to alkali: A sample having a size of 5 cm×5 cm was (1) dried at 115° C. for 20 hours, (2) immersed in 1N sodium hydroxide aqueous solution at 70° C. for 60 minutes, and then (3) dried at 115° C. for 20 hours. Then, a weight change rate was measured. The weight change rate was calculated by the following expression.

Weight change rate [wt %]=$(W1-W2) \times 100/W1$ wherein W1 represents the weight of the sample after (1) and W2 represents the weight of the sample after (3).

Resistance to acid: A sample having a size of 5 cm×5 cm was (4) dried at 115° C. for 20 hours, (5) immersed in 4N hydrochloric acid aqueous solution at 60° C. for 60 minutes, and then (6) dried at 115° C. for 20 hours. Then, a weight change rate was measured. The weight change rate was calculated by the following expression.

Weight change rate [wt %]=$(W3-W4) \times 100/W3$ wherein W3 represents the weight of the sample after (4) and W4 represents the weight of the sample after (6).

Symbols of resistance to alkali and resistance to acid in Table 1 have the following meanings. O: Weight change rate less than 0.1 wt %. x: Weight change rate 0.1 wt % or more.

TABLE 1

|  | Ex. 1 | Ex. 2 | Ex. 3 | Ex. 4 | Ex. 5 | Ex. 6 |
|---|---|---|---|---|---|---|
| Glass transition temperature (° C.) | 229.6 | 238.8 | 255.8 | 260.3 | 252.9 | 263.9 |
| Thermal expansion coefficient (ppm/° C.) | 33.8 | 42.5 | 32.1 | 23.9 | 28.8 | 34.3 |
| Soldering heat resistance | O | O | O | O | O | O |
| Heat resistance after moisture absorption | O | O | O | O | O | O |
| Resistance to alkali | O | O | O | O | O | O |
| Resistance to acid | O | O | O | O | O | O |
| Flame resistance 1 | V-0 | V-0 | V-0 | V-0 | V-0 | V-0 |
| Flame resistance 2 | V-0 | V-0 | V-0 | V-0 | V-0 | V-0 |

|  | Ex. 7 | Ex. 8 | Ex. 9 | Ex. 10 | Ex. 11 |
|---|---|---|---|---|---|
| Glass transition temperature (° C.) | 233.0 | 241.7 | 250.1 | 232.2 | 242.8 |
| Thermal expansion coefficient (ppm/° C.) | 40.5 | 23.8 | 43.7 | 40.2 | 23.9 |
| Soldering heat resistance | O | O | O | O | O |

TABLE 1-continued

|  |  |  |  |  |  |
|---|---|---|---|---|---|
| Heat resistance after moisture absorption | ○ | ○ | ○ | ○ | ○ |
| Resistance to alkali | ○ | ○ | ○ | ○ | ○ |
| Resistance to acid | ○ | ○ | ○ | ○ | ○ |
| Flame resistance 1 | V-0 | V-0 | V-0 | V-0 | V-0 |
| Flame resistance 2 | V-0 | V-0 | V-0 | V-0 | V-0 |

|  | CEx. 1 | CEx. 2 | CEx. 3 | CEx. 4 | CEx. 5 | CEx. 6 | CEx. 7 | CEx. 8 |
|---|---|---|---|---|---|---|---|---|
| Glass transition temperature (°C.) | 218.9 | 230.2 | 254.9 | 261.0 | 257.5 | 254.2 | 266.9 | 254.9 |
| Thermal expansion coefficient(ppm/°C.) | 32.5 | 41.4 | 32.5 | 23.5 | 22.9 | 29.8 | 35.2 | 24.1 |
| Soldering heat resistance | X | X | ○ | ○ | X | ○ | ○ | ○ |
| Heat resistance after moisture absorption | ○ | ○ | ○ | ○ | X | ○ | X | ○ |
| Resistance to alkali | X | X | ○ | ○ | X | ○ | ○ | ○ |
| Resistance to acid | X | X | ○ | ○ | X | ○ | ○ | ○ |
| Flame resistance 1 | V-0 | V-0 | V-1 | V-1 | V-0 | V-1 | V-0 | V-0 |
| Flame resistance 2 | V-0 | V-0 | V-1 | V-1 | V-0 | V-1 | V-0 | V-1 |

Ex. = Example
CEx. = Comparative Example

Table 1 shows that Examples 1 to 11 according to the present invention were excellent in resistance to chemical and soldering heat resistance over Comparative Examples 1, 2 and 5 each of which used gibbsite as a flame retardant, that Examples 1 to 11 were excellent in flame resistance over Comparative Examples 3 and 4 each of which did not use a silicone powder and Comparative Examples 6 and 8 each of which used a prepolymer of 2,2-bis(4-cyanatophenyl)propane, and that Examples 1 to 11 were excellent in heat resistance after moisture absorption over Comparative Example 7 which used a phenol novolak type cyanate. Accordingly, it has been confirmed that the laminate of the prepreg obtained according to the present invention has excellent resistance to chemical, high glass transition temperature and excellent heat resistance and can attain UL94V-0 flame resistance without a halogen-containing flame retardant.

What is claimed is:

1. A prepreg comprising a resin composition containing a naphthol aralkyl type cyanate ester resin (A) represented by the formula (1), a nonhalogen epoxy resin (B), boehmite (C) and a silicone powder (D), and a base material (E), wherein the amount of the boehmite (C) per 100 parts by weight of the total amount of the naphthol aralkyl type cyanate ester resin (A) and the nonhalogen epoxy resin (B) is 50 to 300 parts by weight and the amount of the silicone powder (D) per 100 parts by weight of the total amount of the naphthol aralkyl type cyanate ester resin (A) and the nonhalogen epoxy resin (B) is 5 to 30 parts by weight,

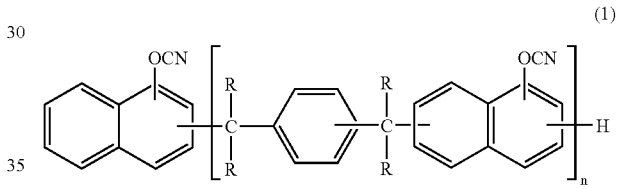

(1)

wherein R represents a hydrogen atom or a methyl group and n is an integer of 1 to 50.

2. The prepreg according to claim 1, wherein the ratio (CN/Ep) between the number of cyanate (CN) groups in the naphthol aralkyl type cyanate ester resin (A) and the number of epoxy (Ep) groups in the nonhalogen epoxy resin (B) in the resin composition is in the range of 0.7 to 2.5.

3. A laminate obtained by curing the prepreg as defined claim 1.

4. A metal-foil-clad laminate obtained by laminating the prepreg as defined in claim 1 and a metal foil and curing the prepreg with the metal foil.

* * * * *